(12) United States Patent
Gallagher et al.

(10) Patent No.: US 9,136,037 B1
(45) Date of Patent: *Sep. 15, 2015

(54) ADHESION PROMOTER

(71) Applicant: Rohm and Haas Electronic Materials LLC, Marlborough, MA (US)

(72) Inventors: Michael K. Gallagher, Hopkinton, MA (US); Joseph F. Lachowski, Sutton, MA (US); Gregory P. Prokopowicz, Worcester, MA (US); Zidong Wang, Southborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/228,244

(22) Filed: Mar. 27, 2014

(51) Int. Cl.
*H01B 3/30* (2006.01)
*C09D 7/12* (2006.01)
*C09D 125/02* (2006.01)
*H01B 13/06* (2006.01)

(52) U.S. Cl.
CPC ............. *H01B 3/307* (2013.01); *C09D 7/1233* (2013.01); *C09D 125/02* (2013.01); *H01B 13/06* (2013.01)

(58) Field of Classification Search
None
See application file for complete search history.

(56) References Cited

U.S. PATENT DOCUMENTS

| 5,220,047 | A | * | 6/1993 | Pohl et al. | 556/420 |
| 5,412,087 | A | * | 5/1995 | McGall et al. | 536/24.3 |
| 5,668,210 | A | | 9/1997 | Harris et al. | |
| 5,994,489 | A | | 11/1999 | Harris et al. | |
| 6,375,789 | B1 | * | 4/2002 | Katz et al. | 156/329 |
| 6,416,869 | B1 | | 7/2002 | Ooij | |
| 2006/0147730 | A1 | | 7/2006 | O'Connell | |
| 2012/0220716 | A1 | * | 8/2012 | Nakatani et al. | 524/572 |
| 2013/0310500 | A1 | * | 11/2013 | Stokes et al. | 524/262 |
| 2014/0120244 | A1 | | 5/2014 | Wang | |
| 2014/0357804 | A1 | * | 12/2014 | Ito et al. | 525/332.9 |

FOREIGN PATENT DOCUMENTS

| GB | 816056 | 7/1959 |
| JP | 2000-344940 A | 12/2000 |
| JP | 5128574 B2 | 11/2012 |

OTHER PUBLICATIONS

Co-Pending U.S. Appl. No. 14/062,677, filed Oct. 24, 2013.

* cited by examiner

*Primary Examiner* — Robert S Loewe
(74) *Attorney, Agent, or Firm* — S. Matthew Caims

(57) ABSTRACT

Compositions useful for improving the adhesion of coating compositions, such as dielectric film-forming compositions, include a hydrolyzed amino-alkoxysilane having a protected amino moiety. These compositions are useful in methods of improving the adhesion of coating compositions to a substrate, such as an electronic device substrate.

10 Claims, No Drawings

ADHESION PROMOTER

The present invention relates to the field of coating compositions, and more particularly to improving the adhesion of certain coating compositions to a substrate.

Coating compositions are widely used in the electronics industry to deposit various organic-containing materials, such as polymeric materials, on a variety of substrates. Often the substrates are inorganic or have inorganic areas on the surface to be coated. For example, coating compositions such as dielectric film-forming compositions and bonding or adhesive compositions are often applied to glass, metal surfaces, and/or semiconductor surfaces such as silicon, gallium-arsenide, and silicon-germanium. Many organic materials do not adhere well to substrates having inorganic surfaces because they do not contain groups that have an affinity for such surfaces. Accordingly, it is common practice to treat such substrate surfaces with an adhesion promoter prior to disposing an organic-containing coating composition on it. Silanes are among the more common adhesion promoters used industrially.

Arylcyclobutene-based materials have been used in a wide variety of applications in the electronics industry due to their superior dielectric properties, excellent gap-fill and planarization properties, and low moisture adsorption. To use arylcyclobutene materials in applications such as interlevel dielectrics and wafer bonding applications, adequate adhesion of the arylcyclobutene material to various substrates (such as silicon, silicon nitride, gold, and copper) is required. Arylcyclobutene materials by themselves do not possess sufficient adhesion to these substrates, and therefore, an adhesion promoter is usually applied to enhance adhesion prior to coating the arylcyclobutene material.

Various adhesion promoters are known for use with arylcyclobutenes. For example, U.S. Pat. No. 5,668,210 discloses certain alkoxysilanes as adhesion promoters for arylcyclobutenes. Only monosilanes are disclosed in this patent. These alkoxysilanes are hydrolyzed with 10 to 80% of the stoichiometric amount (that is mole %) of water. However, conventional adhesion promoters are not able to meet the increasing requirements of the electronics industry for smaller feature sizes (<10 μm) and more complex chip designs, often resulting in delamination or other adhesive failures. U.S. patent application Ser. No. 14/062,677 (Wang et al.) discloses certain poly(alkoxysilane) adhesion promoters containing a secondary amino group to improve the adhesion of dielectrics to substrates in applications having smaller feature sizes.

Newer dielectric materials are often base developable, meaning that they possess base-reactive functionality, such as acid groups. Such acid group containing dielectric materials are incompatible with basic adhesion promoters, such as hydrolyzed amino group containing alkoxysilanes in waste streams in various manufacturing processes. For example, when such acid group containing dielectric materials come into contact with basic adhesion promoters, such as hydrolyzed amino group containing alkoxysilanes, salts form which cause unwanted precipitation or clogging in drain lines, coating equipment, and the like. There remains a need for adhesion promoters suitable for use with dielectric materials having base-reactive functionality, and which are able to meet the requirements of the electronics industry for <10 μm feature sizes and more complex chip designs, while being compatible with such dielectric materials in waste streams. The present invention addresses one or more of these deficiencies.

The present invention provides a composition comprising: a hydrolyzed amino-alkoxysilane having a protected amino moiety; water; and organic solvent. The present invention further provides a composition comprising: a hydrolyzed amino-alkoxysilane having a protected amino moiety; an oligomer chosen from polyarylene oligomers, poly(cyclic-olefin) oligomers, arylcyclobutene oligomers, vinyl aromatic oligomers, and mixtures thereof; water; and organic solvent.

Also provided by the present invention is a process for manufacturing an electronic device, comprising: providing an electronic device substrate having a surface to be coated; treating the surface to be coated with a composition comprising: a hydrolyzed amino-alkoxysilane having a protected amino moiety; water; and organic solvent; disposing a coating composition comprising an oligomer chosen from polyarylene oligomers, poly(cyclic-olefin) oligomers, arylcyclobutene oligomers, vinyl aromatic oligomers, and mixtures thereof on the treated surface; and curing the coating composition.

Further, the present invention provides a process for manufacturing an electronic device, comprising: providing an electronic device substrate having a surface to be coated; treating the surface to be coated with a composition comprising: a hydrolyzed amino-alkoxysilane having a protected amino moiety; an oligomer chosen from polyarylene oligomers, poly(cyclic-olefin) oligomers, arylcyclobutene oligomers, vinyl aromatic oligomers, and mixtures thereof; water; and organic solvent; and curing the oligomer.

As used throughout this specification, the following abbreviations shall have the following meanings, unless the context clearly indicates otherwise: ° C.=degree Celsius; g=gram; L=liter; mL=milliliter; ppm=part per million; mm=millimeter; m=micron=micrometer; nm=nanometer; and A=angstrom. "Wt %" refers to percent by weight, based on the total weight of a referenced composition, unless otherwise noted. All amounts are wt % and all ratios are molar ratios, unless otherwise noted. All numerical ranges are inclusive and combinable in any order, except where it is clear that such numerical ranges are constrained to add up to 100%. The articles "a", "an" and "the" refer to the singular and the plural.

As used throughout the specification, "feature" refers to the geometries on a substrate, and particularly on a semiconductor wafer. The term "alkyl" includes linear, branched and cyclic alkyl. Likewise, "alkenyl" refers to linear, branched and cyclic alkenyl. "Aryl" refers to aromatic carbocycles and aromatic heterocycles. The term "oligomer" refers to dimers, trimers, tetramers and other relatively low molecular weight materials that are capable of further curing. By the term "curing" is meant any process, such as polymerization or condensation, that increases the molecular weight of a material or composition.

It has been surprisingly found that hydrolyzed amino-alkoxysilanes having a protected amine moiety are particularly effective adhesion promoters for coating oligomers chosen from polyarylene oligomers, poly(cyclic-olefin) oligomers, arylcyclobutene oligomers, vinyl aromatic oligomers, and mixtures thereof used in the manufacture of electronic devices. Such coating oligomers are useful in preparing dielectric coatings, photodefinable coatings, temporary bonding adhesives, and permanent bonding adhesives, among other applications.

A variety of hydrolyzed amino-alkoxysilanes are useful in the present invention. As used herein, the term "alkoxysilanes" includes "acyloxysilanes". As used herein, the term "hydrolyzed amino-alkoxysilanes" refers to compounds having one or more primary or secondary amino moieties, and one or more silicon atoms having one or more hydroxyl substituents, and includes partially hydrolyzed and fully hydrolyzed amino-alkoxysilanes. Partially hydrolyzed amino-alkoxysilanes have at least one silicon atom in the molecule substituted with hydroxyl and at least one silicon atom in the molecule is substituted with a hydrolyzable group such as ($C_1$-$C_6$)alkoxy or ($C_1$-$C_6$)acyloxy. Fully hydrolyzed amino-alkoxysilanes have silicon atoms in which all hydrolyzable substituents on the silicon atoms have been replaced with hydroxyls. In the present hydrolyzed amino-alkoxysilanes, the amino moiety is preferably separated from the silicon atom by one or more non-nitrogen and non-silicon atoms, such as carbon.

The hydrolyzed amino-alkoxysilanes of the invention have a protected amino moiety, that is, a primary or secondary amino moiety in the hydrolyzed amino-alkoxsilane has one of its hydrogens replaced with an amine protecting group moiety. Various amine protecting groups are suitable for use in the present invention, provided such protecting groups are removable (cleavable) by heat, acid, or a combination thereof. Preferably, the amine protecting group is thermally cleavable, such as at a temperature of from 50 to 200° C., more preferably from 75 to 200° C., even more preferably from 75 to 175° C., and yet more preferably from 100 to 175° C. Suitable amine protecting groups useful in the present invention include: carbamates such as 9-fluorenylmethyl carbamates, t-butyl carbamates, and benzyl carbamates; amides such as acetamides, trifluoroacetamides and p-toluenesulfonamides; benzylamines; triphenylmethylamines (tritylamines); and benzylideneamines. Carbamates are the preferred amine protecting group, and t-butyl carbamates (t-BOC) are more preferred. Such amine protecting groups, their formation and their removal are well-known in the art. See, for example, T. W. Green et al., *Protective Groups in Organic Synthesis*, Wiley-Interscience, New York, 1999.

Preferred hydrolyzed amino-alkoxysilanes are those of the formula (I):

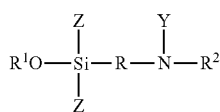

(I)

wherein R is independently chosen from ($C_1$-$C_6$)alkylidene, ($C_1$-$C_6$)alkylene, ($C_6$-$C_{10}$)arylene, and ($C_2$-$C_6$)alkenylene; $R^1$ is independently chosen from H, ($C_1$-$C_6$)alkyl and ($C_1$-$C_6$)acyl; $R^2$ is chosen from H, —R—$SiZ_2$($OR^1$), ($C_1$-$C_6$)alkyl, ($C_6$-$C_{10}$)aryl and ($C_7$-$C_{15}$)alkaryl; each Z is independently chosen from ($C_1$-$C_6$)alkyl, ($C_2$-$C_6$)alkenyl and —$OR^1$; and Y=an amine protecting group; wherein each R is optionally substituted with one or more of —($C_1$-$C_6$)alkylidene-$SiZ_2$($OR^1$) and —($C_1$-$C_6$)alkylene-$SiZ_2$($OR^1$), and wherein at least one $R^1$ is H. Each R is preferably independently chosen from ($C_1$-$C_6$)alkylidene, ($C_1$-$C_6$)alkylene, and ($C_2$-$C_6$)alkenylene, each optionally substituted with one or more of ($C_1$-$C_6$)alkylidene-Si(Z)$_2$($OR^1$) and ($C_1$-$C_6$)alkylene-Si(Z)$_2$($OR^1$). More preferably, each R is independently chosen from ($C_2$-$C_6$)alkylidene, ($C_2$-$C_6$)alkylene, and ($C_2$-$C_6$)alkenylene. When an R group is substituted with ($C_1$-$C_6$)alkylidene-Si(Z)$_2$($OR^1$) or ($C_1$-$C_6$)alkylene-Si(Z)$_2$($OR^1$), it is preferred that 1 to 2 of such groups are present. Each $R^1$ is preferably chosen from H, ($C_1$-$C_4$)alkyl and ($C_2$-$C_6$)acyl; more preferably from H, ($C_1$-$C_3$)alkyl and ($C_2$-$C_4$)acyl, and even more preferably each $R^1$=H. It is preferred that each Z is chosen from ($C_1$-$C_4$)alkyl, ($C_2$-$C_6$)alkenyl and —$OR^1$; and more preferably each Z is —$OR^1$. Preferably, $R^2$ is chosen from H, —R—$SiZ_2$($OR^1$), ($C_1$-$C_6$)alkyl, and ($C_7$-$C_{15}$)alkaryl, and more preferably H, —R—$SiZ_2$($OR^1$), and ($C_1$-$C_6$)alkyl. It is preferred that Y is chosen from —C(O)—O—$R^3$, —C(O)—$R^4$, ($C_7$-$C_{20}$)alkaryl, =CH—$C_6H_5$, and —$SO_2$—$R^5$. $R^3$ is monovalent hydrocarbyl moiety having 1 to 20 carbons, preferably 2 to 18 carbons, and more preferably 4 to 14 carbons. Preferred hydrocarbyl moieties for $R^3$ are t-butyl, benzyl, and 9-fluorenylmethyl, and more preferably t-butyl. $R^4$ is a ($C_1$-$C_6$)alkyl, which may be substituted with one or more halogens. It is preferred that $R^4$ is chosen from methyl and trifluoromethyl. $R^5$ is a monovalent hydrocarbyl moiety having 1 to 10 carbons, and preferably 1 to 7 carbons. It is preferred that $R^5$ is tolyl. More preferably, Y is chosen from 9-fluorenylmethyloxy carbonyl, t-butoxy carbonyl, benzyloxy carbonyl, acetyl, trifluoroacetyl, benzyl, trityl, benzylidene, and tosyl.

Also preferred are hydrolyzed amino-poly(alkoxy)silanes of the formula (II):

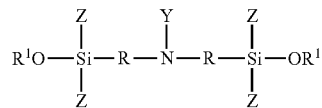

wherein each R is independently chosen from ($C_1$-$C_6$)alkylidene, ($C_1$-$C_6$)alkylene, ($C_6$-$C_{10}$)arylene, and ($C_2$-$C_6$)alkenylene; each $R^1$ is independently chosen from H, ($C_1$-$C_6$)alkyl and ($C_1$-$C_6$)acyl; each Z is independently chosen from ($C_1$-$C_6$)alkyl, ($C_2$-$C_6$)alkenyl and —$OR^1$; and Y=an amine protecting group; wherein each R is optionally substituted with one or more of —($C_1$-$C_6$)alkylidene-$SiZ_2$($OR^1$) and —($C_1$-$C_6$)alkylene-$SiZ_2$($OR^1$), and wherein at least one $R^1$ is H. Each R is preferably independently chosen from ($C_1$-$C_6$)alkylidene, ($C_1$-$C_6$)alkylene, and ($C_2$-$C_6$)alkenylene, each optionally substituted with one or more of ($C_1$-$C_6$)alkylidene-Si(Z)$_2$($OR^1$) and ($C_1$-$C_6$)alkylene-Si(Z)$_2$($OR^1$). More preferably, each R is independently chosen from ($C_2$-$C_6$)alkylidene, ($C_2$-$C_6$)alkylene, and ($C_2$-$C_6$)alkenylene. When an R group is substituted with ($C_1$-$C_6$)alkylidene-Si(Z)$_2$($OR^1$) or ($C_1$-$C_6$)alkylene-Si(Z)$_2$($OR^1$), it is preferred that 1 to 2 of such groups are present. Each $R^1$ is preferably chosen from H, ($C_1$-$C_4$)alkyl and ($C_2$-$C_6$)acyl; more preferably from H, ($C_1$-$C_3$)alkyl and ($C_2$-$C_4$)acyl, and even more preferably each $R^1$=H. It is preferred that each Z is chosen from ($C_1$-$C_4$)alkyl, ($C_2$-$C_6$)alkenyl and —$OR^1$; and more preferably each Z is —$OR^1$. Preferably, $R^2$ is chosen from H, —R—$SiZ_2$($OR^1$), ($C_1$-$C_6$)alkyl, and ($C_7$-$C_{15}$)alkaryl, and more preferably H, —R—$SiZ_2$($OR^1$), and ($C_1$-$C_6$)alkyl. It is preferred that Y is chosen from —C(O)—O—$R^3$, —C(O)—$R^4$, ($C_7$-$C_{20}$)alkaryl, =CH—$C_6H_5$, and —$SO_2$—$R^5$. $R^3$ is a monovalent hydrocarbyl moiety having 1 to 20 carbons, preferably 2 to 18 carbons, and more preferably 4 to 14 carbons. Preferred hydrocarbyl moieties for $R^3$ are t-butyl, benzyl, and 9-fluorenylmethyl, and more preferably t-butyl. $R^4$ is a ($C_1$-$C_6$)alkyl, which may be substituted with one or more halogens. It is preferred that $R^4$ is chosen from methyl and trifluoromethyl. $R^5$ is a monovalent hydrocarbyl moiety having 1 to 10 carbons, and preferably 1 to 7 carbons. It is preferred that $R^5$ is tolyl. More preferably, Y is chosen from 9-fluorenylmethyloxy carbonyl, t-butoxy carbonyl, benzyloxy carbonyl, acetyl, trifluoroacetyl, benzyl, trityl, benzylidene, and tosyl.

The present hydrolyzed amino-alkoxysilanes are preferably prepared by first protecting the amino moiety and then hydrolyzing one or more of the hydrolyzable groups on the silicon atom. In the alternative, the present hydrolyzed amino-alkoxysilanes are prepared by first hydrolyzing one or more of the hydrolyzable groups on the silicon atom and then protecting the amino moiety. Suitable amino-alkoxysilanes include, but are not limited to: 4-aminobutyl dimethyl methoxy silane; N-(2-aminoethyl)-3-aminopropyl dimethyl methoxy silane; N-(2-aminoethyl)-3-aminopropyl methyl dimethoxy silane; N-(2-aminoethyl)-3-aminopropyl trimethoxy silane; 3-aminopropyl methyl diethoxy silane; 3-aminopropyl triethoxy silane; 3-aminopropyl trimethoxy silane; bis[3-(trimethoxysilyl)propyl]amine; $N^1,N^1$-bis(3-(trimethoxysilyl)propyl)ethane-1,2-diamine; 3-(trimethoxysilyl)-N-(2-(trimethoxysilyl)ethyl)-N-(3-trimethoxysilyl)propyl)propan-1-amine; and bis(3,3,9,9-tetramethoxy-2,10-dioxa-3,9-disilaundecan-6-yl)amine. Amino-alkoxysilanes are commercially available from a variety of sources, such as Sigma-Aldrich (St. Louis, Mo.), or may be prepared by any suitable method known in the literature. The amino-alkoxysilanes may be used without further purification, or may be purified using suitable procedures known to those skilled in the art.

Various procedures for protecting amino moieties are known in the art and any of these procedures may be used to protect the amino moiety in the present amino-alkoxysilanes. In general, an amine protecting group precursor compound is combined with the amino-alkoxysilane in a suitable solvent, optionally in the presence of a catalyst, and allowed to react for a period of time at a suitable temperature. The selection of such amine protecting group precursor compound, solvent, optional catalyst, time and temperature are well-known in the art. See, for example, T. W. Green et al., *Protective Groups in Organic Synthesis*, Wiley-Interscience, New York, 1999. For example, to form a t-butyl carbamate (or t-BOC) as the protected amino moiety, an amino-alkoxysilane is dissolved in an ether solvent and then combined with a desired amount of di-t-butyl dicarbonate and allowed to react overnight at room temperature. In general, the molar ratio of amine protecting group precursor compound to amino moiety is ≥0.8:1, preferably ≥0.9:1, yet more preferably ≥1:1, such as from 1:1 to 2:1, and even more preferably >1:1, such as from 1.05:1 to 1.5:1. It is preferred that a molar excess of amine protecting group precursor compound be used to form the present amino-alkoxysilanes having a protected amino moiety.

The amino-alkoxysilanes may be hydrolyzed according to procedures known in the art, such as where the amino-alkoxysilane is contacted with a desired amount of water, or by contacting the amino-alkoxysilane with water in the presence of a volatile solvent, or by simply combining the amino-alkoxysilane with a suitable solvent where the solvent has sufficient residual water content to effect the desired level of hydrolysis. If a volatile solvent (or solvent mixture) is used, it is optionally removed prior to the hydrolyzed amino-alkoxysilane being incorporated into compositions comprising a coating oligomer. Alternatively, the hydrolysis is performed by combining the amino-alkoxysilane with a suitable organic solvent having sufficient residual water to effect the desired level of hydrolysis. In another alternative, a desired amount of water is first combined with a desired solvent, and then this mixture is combined with the amino-alkoxysilane. The amount of water used is that amount sufficient to provide a desired level of hydrolysis. Typically, the amount of water is from 0.01 to 3 wt % water, based on the total weight of the composition. Optionally, an acidic or basic catalyst may be employed in the hydrolysis reaction, preferably an acidic catalyst is used.

The optional acidic or basic catalysts may be any acidic or basic compound, or ion exchange resin or membrane, which will catalyze the hydrolysis of the amino-alkoxysilane. Examples of acidic catalysts include but are not limited to nitric acid, hydrochloric acid, sulfuric acid, trifluoroacetic acid, chloroacetic acid, methane sulfonic acid, and phosphoric acid. Examples of basic catalysts include but are not limited to potassium hydroxide, sodium hydroxide, ammonium hydroxide, tetramethylammonium hydroxide, tetraethylammonium hydroxide, and tertiary amines. When present, the catalyst is used in amounts sufficient to catalyze the hydrolysis reaction. The amount of catalyst advantageously employed will depend upon a number of factors including the desired rate of hydrolysis, the catalyst, the amino-alkoxysilane used, and the degree of hydrolysis desired. Preferably, the catalyst is present in molar ratios of 0.1:1 to 3:1 catalyst to amino-alkoxysilane. More preferably, the catalyst is present in a molar ratio of 0.2:1 to 1.5:1, and yet more preferably 0.25:1 to 1:1, catalyst to amino-alkoxysilane.

In the hydrolysis reaction, the amino-alkoxysilane, water, solvent, and optional catalyst are mixed until the desired hydrolysis is complete. While the time to complete the hydrolysis will vary depending on a number of factors, including the specific reactants employed and the level of hydrolysis desired, in general, the hydrolysis is complete in 1 minute to 48 hours, preferably from 1 minute to 24 hours, and more preferably from 1 minute to 12 hours. In general, because of the low levels of water used, the amino-alkoxysilane, water, and solvent will form a single-phase mixture. Preferably, the organic solvent, or organic solvent mixture, is selected such that the organic solvent is miscible with water in all proportions. In general, the mixture is agitated for 1 minute to 2 hours after a single phase is obtained to complete the hydrolysis reaction. The temperature at which hydrolysis is conducted is preferably from about 15 to 100° C., more preferably from 20 to 50° C., and most preferably from 20 to 25° C. Hydrolysis rates increase with increasing temperatures. Preferably, the hydrolysis is conducted in the absence of a catalyst. In such procedure, the desired amount of water is mixed with the desired solvent, then combined with the amino-alkoxysilane and stirred for a sufficient period of time for the desired extent of hydrolysis to occur. Preferably, the solvent used is the same solvent used to prepare the treating (adhesion promoter) composition. This method may take up to several days depending upon the particular amino-alkoxysilane and the temperature at which hydrolysis occurs. In some applications this method may be preferred when residual catalyst levels have an adverse effect on subsequent use of the hydrolyzed amino-alkoxysilane.

While not wishing to be bound by theory, it is believed that hydrolysis of amino-alkoxysilanes produces a mixture of partially hydrolyzed and fully hydrolyzed amino-alkoxysilanes, and possibly oligomerized amino-alkoxysilanes. The term "hydrolyzed amino-alkoxysilane" is meant to include partially hydrolyzed and fully hydrolyzed amino-alkoxysilanes, individually and in admixture, each optionally in the presence of nonhydrolyzed amino-alkoxysilanes or oligomerized amino-alkoxysilanes. Oligomerization occurs when a hydrolyzed or partially hydrolyzed amino-alkoxysilane reacts with another amino-alkoxysilane to produce water and an Si—O—Si bond. As used herein, the term "hydrolyzed amino-alkoxysilane" encompasses all levels of hydrolysis of the amino-alkoxysilane, that is, partially hydrolyzed and fully hydrolyzed, as well as oligomerized amino-alkoxysilane. Mixtures of hydrolyzed amino-alkoxysilanes may be used in the present invention.

Adhesion promoter compositions of the invention comprise a hydrolyzed amino-alkoxysilane having a protected amino moiety, water and an organic solvent. Water may be added separately to the composition, or may be present with the hydrolyzed amino-alkoxysilane, or may be present in the organic solvent used. The solvent used in the present adhesion promoting compositions can be any single organic solvent or mixture of two or more organic solvents in which the hydrolyzed amino-alkoxysilane is soluble. Exemplary organic solvents include, without limitation: aromatic hydrocarbons such as toluene, xylene, mesitylene and alkylnaphthalenes; alcohols such as 2-methyl-1-butanol, 4-methyl-2-pentanol, and methyl isobutyl carbinol; esters such as ethyl lactate, propylene glycol methyl ether acetate (PGMEA), and methyl 2-hydroxyisobutyrate; lactones such as gamma-butyrolactone; lactams such as N-methylpyrrolidinone; ethers such as anisole, propylene glycol methyl ether (PGME), dipropylene glycol methyl ether (DPGME), and dipropylene glycol dimethyl ether isomers (commercially available from The Dow Chemical Company as Proglyde™ DMM); ketones such as cyclohexanone and methylcyclohexanone; and mixtures thereof.

Optionally, the present adhesion promoter composition may comprise one or more additives chosen from a metal passivation agent and a latent acid catalyst. Metal passivation agents may be useful to prevent corrosion of metal contained on the surface of the substrate to be treated. Such corrosion may result from residual acid catalyst used in the hydrolysis of the present amino-alkoxysilanes. Various metal passivation agents are known in the art, and any may be used in the present compositions. Suitable metal passivation agents include, without limitation, triazole, substituted triazoles, benzotriazole, substituted benzotriazoles tetrazole, substituted tetrazoles, imidazole, substituted imidazoles, benzimidazole, substituted benzimidazoles, and the like. Such metal passivation agents are typically used in an amount of from 0 to 5000 ppm, preferably from 0 to 1000 ppm, and more preferably from 1 to 1000 ppm. Latent acid catalysts may be added to the adhesion promoter compositions to help cleave the amine protecting group from the hydrolyzed amino-alkoxysilanes. Latent acid catalysts include thermal acid generators and photoacid generators. A variety of thermal acid generators and photoacid generators are known in the art, and any may be used in the present invention. Such latent acid catalysts are typically present in the adhesion promoter compositions in molar ratios of 0.1:1 to 3:1 latent catalyst to hydrolyzed amino-alkoxysilane. More preferably, the latent catalyst is present in a molar ratio of 0.2:1 to 1.5:1, and yet more preferably 0.25:1 to 1:1, latent catalyst to hydrolyzed amino-alkoxysilane.

In general, the present adhesion promoter compositions comprise from 0.01 to 10 wt % of amino-alkoxysilane and/or hydrolyzed amino-alkoxysilane, from 0.01 to 3 wt % water, and from 90 to 99.98 wt % of organic solvent. Preferably, the adhesion promoter compositions comprise from 0.01 to 5 wt % of amino-alkoxysilane and/or hydrolyzed amino-alkoxysilane, more preferably from 0.01 to 3 wt %, and even more preferably from 0.05 to 2 wt %. The amount of water is preferably from 0.05 to 2 wt %, and more preferably from 0.1 to 2 wt %. Preferably, the adhesion promoter compositions comprise from 90 to 99.95 wt % of organic solvent, more preferably from 95 to 99.95 wt %, and even more preferably from 98 to 99.9 wt %. Particularly preferred compositions comprise from 0.1 to 2 wt % of amino-alkoxysilane and/or hydrolyzed amino-alkoxysilane, from 0.05 to 1.5 wt % water, and from 97 to 99.95 wt % of organic solvent.

The present adhesion promoter compositions are typically applied to an electronic device substrate to improve the adhesion of subsequently applied coating compositions. The present process of manufacturing a device, comprises: providing a device substrate having a surface to be coated; treating the surface to be coated with a composition comprising a hydrolyzed amino-alkoxysilane having a protected amino moiety, water, and an organic solvent; and disposing a composition comprising an oligomer chosen from polyarylene oligomers, poly(cyclic-olefin) oligomers, arylcyclobutene oligomers, vinyl aromatic oligomers, and mixtures thereof on the treated surface.

The device may be any suitable substrate used in the manufacture of electronic devices, including, without limitation: packaging substrates such as multichip modules; flat panel display substrates; integrated circuit substrates, substrates for light emitting diodes (LEDs), semiconductor wafers, polycrystalline silicon substrates, and the like. Exemplary device substrates which can be coated with the coating composition include metals such as aluminum, copper, gold, silver, titanium, tantalum, nickel, tin, tin-alloys, and the like; ceramics such as alumina, silica, sapphire, MgO, BeO, including spinels, aluminum nitride, boron nitride, silicon nitride, silicon carbide, and gallium arsenide; glass such as fiber glass, lime glass, flint glass, borosilicate glass, Gorilla™ glass, Pyrex™ glass and Vycor™ glass; and semiconductor wafers. A wide variety of semiconductor wafers may be employed in the present invention. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Particularly suitable substrates are patterned wafers, such as patterned silicon wafers and patterned gallium-arsenide wafers. Such wafers may be any suitable size, such as 200 mm to 300 mm diameter, although wafers having smaller and larger diameters may be used. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being fabricated. Optionally, the substrate may be treated by any suitable known process, such as acid etching, oxygen plasma etching or RCA cleaning, prior to the application of the coating composition to control surface chemistry.

The device substrate surface is treated by contacting it with the present adhesion promoter composition using any suitable method. Exemplary methods well-known in the art include spin-coating, curtain coating, spray coating, roller coating, dip coating, screen printing, and gas phase deposition, among other methods. In the semiconductor manufacturing industry, spin-coating is preferred to take advantage of existing equipment and processes. After being disposed on a substrate surface, the solvent is removed from adhesion promoter composition the prior to the next step, and the amino moiety in the hydrolyzed amino-alkoxysilane is deprotected, that is, the amine protecting group is cleaved (removed). Solvent removal is typically achieved by heating (baking) the substrate for a period of time. Preferably, the treated surface is subjected to conditions that remove the solvent and cleave the amine protecting group in a single step. For a thermally cleavable amine protecting group, such as t-butyl carbamate, the substrate is subjected to a temperature sufficient to cleave the amine protecting group. When a thermal acid generator is used as the latent acid catalyst, the treated substrate is typically subjected to a temperature sufficient to generate the acid catalyst. Suitable temperatures for deprotecting the amine moiety are from 50 to 250° C., preferably from 75 to 200° C., more preferably from 100 to 200° C., and yet more preferably from 125 to 200° C. In general, the treated substrate is heated for a period of time from 5 seconds to 60 minutes, preferably from 5 seconds to 30 minutes, and more preferably from 30 seconds to 10 minutes, to remove the solvent and cleave the amine protecting group.

After treating the device substrate with the adhesion promoter composition, a coating composition comprising an oligomer chosen from polyarylene oligomers, poly(cyclic-olefin) oligomers, arylcyclobutene oligomers, vinyl aromatic oligomers, and mixtures thereof is disposed on the treated surface, preferably the oligomer is chosen from arylcyclobutene oligomers, vinyl aromatic oligomers, and mixtures thereof, and more preferably the oligomer is chosen from arylcyclobutene oligomers. Such composition may be disposed on the substrate using any of the above-described methods for disposing the adhesion promoter on the substrate. Typically, the coating composition comprises one or more oligomers, one or more organic solvents, and optionally one or more additional components such as curing agents, coating enhancers, and the like.

A wide variety of polyarylene oligomers may be used in the present invention. As used herein, the term "polyarylene" includes the term "polyarylene ether." Suitable polyarylene oligomers may be synthesized from precursors such as ethynyl aromatic compounds of the formula:

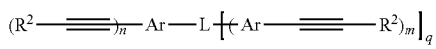

(I)

wherein each Ar is an aromatic group or inertly-substituted aromatic group; each $R^2$ is independently hydrogen, an alkyl, aryl or inertly-substituted alkyl or aryl group; L is a covalent bond or a group which links one Ar to at least one other Ar; n and m are integers of at least 2; and q is an integer of at least 1 or from aromatic compounds having ethylenically unsaturated terminal groups such as acrylate, methyacrylate, and olefin-containing groups. Suitable polyarylene oligomers useful in the present invention comprise polymerized units of the formula:

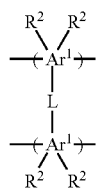

(II)

wherein Ar' is the residual of the reaction of product of $(C≡C)_n$—Ar or Ar—$(C≡C)_m$ moieties and $R^2$, L, n and m are as defined above. Polyarylene copolymer oligomers useful in the invention comprise polymerized units of the formula:

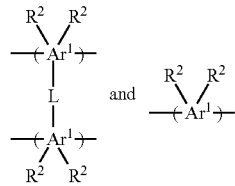

(III)

wherein Ar' and $R^2$ are as defined above.

Exemplary polyarylene oligomers include, but are not limited to, those wherein Ar-L-Ar is: 2,2-diphenylpropane (or —$C_6H_4$—$C(CH_3)_2$—$C_6H_4$—); 9,9'-diphenylfluorene; 2,2-diphenyl hexafluoropropane; biphenylene; diphenylsulfide; oxydiphenylene; diphenyl ether; bis(phenylene)diphenylsilane; bis(phenylene)phosphine oxide; bis(phenylene)benzene; bis(phenylene)naphthalene; bis(phenylene)anthracene; thiodiphenylene; 1,1,1-triphenyleneethane; 1,3,5-triphenylenebenzene; 1,3,5-(2-phenylene-2-propyl)benzene; 1,1,1-triphenylenemethane; naphthylene; 1,1,2,2-tetraphenylene-1,2-diphenylethane; bis(1,1-diphenyleneethyl)benzene; 2,2'-diphenylene-1,1,1,3,3,3-hexafluoropropane; 1,1-diphenylene-1-phenylethane; anthracenylene; and bis(phenylene)napthacene.

Suitable polyarylene oligomers are generally commercially available, such as those sold as SiLK™ Semiconductor Dielectric (available from Dow Electronic Materials, Marlborough, Mass.), or may be prepared by a variety of methods known in the art, such as those disclosed in Int. Pat. App. Nos. WO 97/10193, WO 00/31183, WO 98/11149, WO 97/10193, WO 91/09081, and U.S. Pat. Nos. 5,115,082; 5,155,175; 5,179,188; 5,874,516; and 6,093,636.

Suitable cyclic-olefin materials are poly(cyclic-olefins), which preferably have a weight average molecular weight ($M_w$) of from 2000 to 200,000 Daltons, have a softening temperature (melt viscosity at 3,000 PaS) of at least 100° C. Preferred poly(cyclic-olefins) are comprised of recurring monomers of cyclic-olefins and acyclic olefins, or ring-opening polymers based on cyclic-olefins. Suitable cyclic olefins for use in the present invention are chosen from norbornene-based olefins, tetracyclododecene-based olefins, dicyclopentadiene-based olefins, and derivatives thereof. Derivatives include alkyl (preferably $C_1$-$C_{20}$ alkyls), alkylidene (preferably $C_1$-$C_{20}$ alkylidenes), aralkyl (preferably $C_6$-$C_{30}$ aralkyls), cycloalkyl (preferably $C_3$-$C_{30}$ cycloalkyls), ether, acetyl, aromatic, ester, hydroxy, alkoxy, cyano, amide, imide, and silyl-substituted derivatives. Particularly preferred cyclic-olefins for use in the present invention include those chosen from

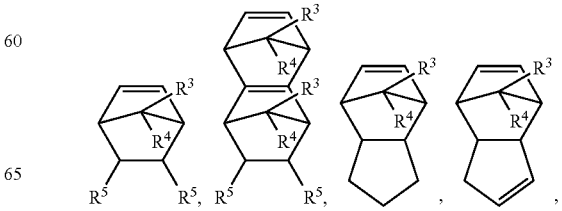

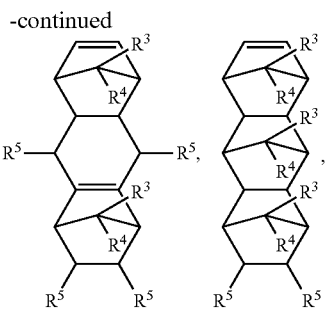

and combinations of the foregoing, where each $R^3$ and $R^4$ is independently chosen from H, and alkyl groups, and each $R^5$ is independently chosen from H, substituted and unsubstituted aryl groups (preferably $C_6$-$C_{18}$ aryls), alkyl groups (preferably $C_1$-$C_{20}$ alkyls), cycloalkyl groups (preferably $C_3$-$C_{30}$ cycloalkyl groups), aralkyl groups (preferably $C_6$-$C_{30}$ aralkyls, such as benzyl, phenethyl, phenylpropyl, and the like), ester groups, ether groups, acetyl groups, alcohols (preferably $C_1$-$C_{10}$ alcohols), aldehyde groups, ketones, nitriles, and combinations thereof. Preferred acyclic olefins are chosen from branched and unbranched $C_2$-$C_{20}$ alkenes.

Suitable cyclic-olefin oligomers are available under the ZEONOR™ (from Zeon Chemicals), ARTON™ (from JSR Corporation), TOPAS™ (available from Topas Advanced Polymers) and APEL™ (produced by Mitsui Chemicals) brands. Alternatively, suitable cyclic olefin oligomers may be prepared by methods known in the art, such as those described in U.S. Pat. Nos. 5,191,026 and 6,008,298.

Arylcyclobutene oligomers are well-known in the art. Suitable arylcyclobutene oligomers include, but are not limited to, those having the formula:

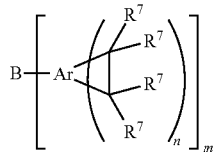

wherein B is an n-valent linking group; Ar is a polyvalent aryl group and the carbon atoms of the cyclobutene ring are bonded to adjacent carbon atoms on the same aromatic ring of Ar; m is an integer of 1 or more; n is an integer of 1 or more; and $R^7$ is a monovalent group. Preferably, the polyvalent aryl group, Ar, may be composed of 1-3 aromatic carbocyclic or heteroaromatic rings. It is preferred that the polyvalent aryl group comprise a single aromatic ring, and more preferably a phenyl ring. The polyvalent aryl group is optionally substituted with 1 to 3 groups chosen from ($C_1$-$C_6$)alkyl, tri($C_1$-$C_6$) alkylsilyl, ($C_1$-$C_6$)alkoxy, and halo, preferably with one or more of ($C_1$-$C_6$)alkyl, tri($C_1$-$C_3$)alkylsilyl, ($C_1$-$C_3$)alkoxy, and chloro, and more preferably with one or more of ($C_1$-$C_3$) alkyl, tri($C_1$-$C_3$)alkylsilyl, and ($C_1$-$C_3$)alkoxy. It is preferred that the polyvalent aryl group is unsubstituted. It is preferred that n=1 or 2, and more preferably n=1. Preferably, m=1-4, more preferably m=2-4, and yet more preferably m=2. It is preferred that $R^7$ is chosen from H and ($C_1$-$C_6$)alkyl, and more preferably from H and ($C_1$-$C_3$)alkyl. Preferably, B comprises one or more carbon-carbon double bonds (ethylenic unsaturation). Suitable single valent B groups preferably have the formula —[C($R^8$)=C$R^9$]$_x$$Z^1$, wherein $R^8$ and $R^9$ are independently chosen from hydrogen, ($C_1$-$C_6$)alkyl, and aryl; $Z^1$ is chosen from hydrogen, ($C_1$-$C_6$)alkyl, aryl, siloxanyl, —$CO_2R^{10}$; each $R^{10}$ is independently chosen from H, ($C_1$-$C_6$)alkyl, aryl, aralkyl, and alkaryl; and x=1 or 2. Preferably, $R^8$ and $R^9$ are independently chosen from H, ($C_1$-$C_3$)alkyl, and aryl, and more preferably H and ($C_1$-$C_3$)alkyl. It is preferred that $R^{10}$ is ($C_1$-$C_3$)alkyl, aryl, and aralkyl. $Z^1$ is preferably siloxyl. Preferred siloxyl groups have the formula —[Si($R^{11}$)$_2$—O]p-Si($R^{11}$)$_2$—, wherein each $R^{11}$ is independently chosen from H, ($C_1$-$C_6$)alkyl, aryl, aralkyl, and alkaryl; and p is an integer from 1 or more. It is preferred that $R^{11}$ is chosen from ($C_1$-$C_3$)alkyl, aryl, and aralkyl. Suitable aralkyl groups include benzyl, phenethyl and phenylpropyl.

Preferably, the arylcyclobutene oligomers comprise one or more oligomers of the formula:

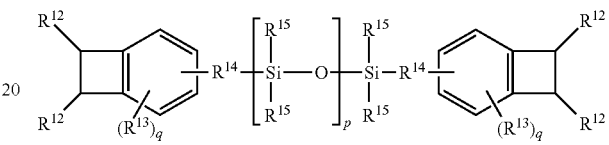

wherein each $R^{12}$ is independently chosen from H and ($C_1$-$C_6$)alkyl, and preferably from H and ($C_1$-$C_3$)alkyl; each $R^{13}$ is independently chosen from ($C_1$-$C_6$)alkyl, tri($C_1$-$C_6$)alkylsilyl, ($C_1$-$C_6$)alkoxy, and halo; each $R^{14}$ is independently a divalent, ethylenically unsaturated organic group; each $R^{15}$ is independently chosen from H, ($C_1$-$C_6$)alkyl, aralkyl and phenyl; p is an integer from 1 or more; and q is an integer from 0-3. Each $R^{12}$ is preferably independently chosen from H and ($C_1$-$C_3$)alkyl, and more preferably each $R^{12}$ is H. It is preferred that each $R^{13}$ is independently chosen from ($C_1$-$C_6$) alkyl, tri($C_1$-$C_3$)alkylsilyl, ($C_1$-$C_3$)alkoxy, and chloro, and more preferably from ($C_1$-$C_3$)alkyl, tri($C_1$-$C_3$)alkylsilyl, and ($C_1$-$C_3$)alkoxy. Preferably, each $R^{14}$ is independently chosen from a ($C_2$-$C_6$)alkenyl, and more preferably each $R^{14}$ is —CH=CH—. Each $R^{15}$ is preferably chosen from ($C_1$-$C_3$) alkyl, and more preferably each $R^{15}$ is methyl. Preferably, p=1-5, more preferably p=1-3, and yet more preferably p=1. It is preferred that q=0. A particularly preferred arylcyclobutene oligomer, 1,3-bis(2-bicyclo[4.2.0]octa-1,3,5-trien-3-yl ethenyl)-1,1,3,3 tetramethyldisiloxane ("DVS-bis-BCB"), has the formula

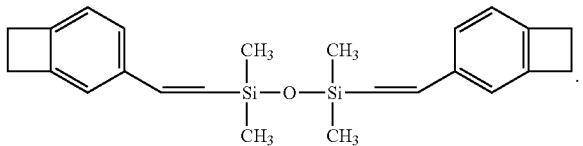 [SMILES: C[Si](C)(C=Cc1ccc2c(c1)CC2)O[Si](C)(C)C=Cc1ccc2c(c1)CC2]

Arylcyclobutene oligomers may be prepared by any suitable means, such as those described in U.S. Pat. Nos. 4,812,588; 5,136,069; 5,138,081; and Int. Pat. App. No. WO 94/25903. Suitable arylcyclobutene oligomers are also commercially available under the CYCLOTENE™ brand, available from Dow Electronic Materials. The arylcyclobutene oligomers may be used as is, or may be further purified by any suitable means.

Vinyl aromatic oligomers are well-known in the art. Such vinyl aromatic oligomers include oligomers of only vinyl aromatic monomers and oligomers of vinyl aromatic monomers with one or more reactive ethylenically unsaturated co-monomers. Suitable vinyl aromatic monomers are unsubstituted vinyl aromatic monomers and substituted vinyl aromatic monomers where one or more hydrogens are replaced with a substituent group selected from the group of ($C_1$-$C_6$) alkyl, ($C_1$-$C_6$)alkoxy, halo, and amino. Exemplary vinyl aromatic monomers include, without limitation, styrene, vinyltoluene, vinylxylene, vinylanisole, vinyldimethoxybenzene, vinylaniline, halostyrene such as fluorostyrene, α-methylstyrene, β-methoxystyrene, ethylvinylbenzene, vinylpyridines, vinylimidazoles, vinylpyrroles, and mixtures thereof. Preferred reactive co-monomers are those comprising a reactive moiety, that is, a moiety capable of further polymerization (or crosslinking) following formation of the vinyl aromatic oligomer, such as an allyl moiety or a vinyl group, in addition to an olefinic (or ethylenically unsaturated) moiety used to for the vinyl aromatic oligomer. More preferably, the reactive co-monomers comprise an allyl moiety in addition to the ethylenic unsaturation used to form the vinyl aromatic oligomer. Exemplary reactive co-monomers include, but are not limited to, vinylcyclohexene, vinyl ethers, asymmetrical dienes or trienes such as terpene monomers, diallyl maleate, allyl acrylate, allyl methacrylate, allyl cinnamate, diallyl fumerate, allyl tiglate, divinylbenzene, and mixtures thereof. It will be appreciated by those skilled in the art that one or more secondary co-monomers may also be used to form the vinyl aromatic oligomers. Such secondary co-monomers are ethylenically unsaturated, but do not contain a reactive moiety. Exemplary secondary co-monomers include, but are not limited to, (meth)acrylic acid, (meth)acrylamides, ($C_1$-$C_{10}$) alkyl (meth)acrylates, aromatic (meth)acrylates, substituted ethylene monomers, and poly(alkylene oxide) monomers.

The molar ratio of vinyl aromatic monomers to co-monomers in such vinyl aromatic oligomers is preferably from 99:1 to 1:99. Typically, vinyl aromatic oligomers are prepared by free-radical polymerization of a vinyl aromatic monomer and a co-monomer, but may be prepared by any method known in the art.

The coating compositions are prepared by combining one or more oligomers as described above with one or more organic solvents, and one or more optional components. It is preferred that the oligomer is an arylcyclobutene oligomer. Suitable organic solvents include those described above for use in the adhesion promoter compositions. Exemplary optional components in the coating compositions include one or more curing agents, one or more anti-oxidants, and the like. Curing agents may aid in the curing of the oligomers, and may be activated by heat or light. Suitable curing agents include thermally generated initiators and photoinitiators. The selection of such curing agents is well within the ability of those skilled in the art. The amount of the oligomers, solvents and optional components in the coating composition may vary across a wide range and is within the ability of one skilled in the art. It will be appreciated by those skilled in the art that the solids content in the coating compositions may be adjusted, along with the spin speed, to achieve a desired thickness of the coating composition on the adhesion promoter treated surface.

The coating compositions may be disposed (or coated) on the adhesion promoted device substrate surface by any suitable method, such as those described above for disposing the adhesion promoter on the device substrate. Such methods of depositing coating compositions are well-known in the art. After being disposed on an adhesion promoted surface, the coating compositions are typically cured using the appropriate method for the oligomer selected. Such curing methods are well-known in the art. For example, arylcyclobutene oligomers may be cured by heating, or in the case of photodefinable arylcyclobutene oligomers by exposure to actinic radiation (light) of an appropriate wavelength.

Also provided by the present invention is a self-priming coating composition comprising a hydrolyzed amino-alkoxysilane having a protected amino moiety, water, organic solvent, and a coating oligomer chosen from polyarylene oligomers, poly(cyclic-olefin) oligomers, arylcyclobutene oligomers, vinyl aromatic oligomers, and mixtures thereof. Preferably, the coating oligomer is chosen from arylcyclobutene oligomers, vinyl aromatic oligomers, and mixtures thereof, and more preferably the coating oligomer is an arylcyclobutene oligomer. Optionally, these self-priming compositions may comprise one or more additional components such as anti-oxidants, photo-cross-linking agents, and coating enhancers. Such optional components are well-known to those skilled in the art. Any of the hydrolyzed amino-alkoxysilanes described above may be used in this composition. Any of the oligomers described above for the coating composition may be used in this self-priming composition, and preferably the oligomer is an arylcyclobutene oligomer. Suitable organic solvents are those described above for use in the adhesion promoter compositions. As used herein, the term "self-priming coating composition" refers to a composition comprising an adhesion promoting hydrolyzed amino-alkoxysilane water, organic solvent, and a coating oligomer. An advantage of these self-priming coating compositions is that a separate step of applying an adhesion promoter can be avoided. Alternatively, these self-priming coating compositions may be used to form a first coating layer, upon which subsequent coating layers are deposited. In certain applications, the use of a self-priming coating composition is preferred over the use of a separate adhesion promoter composition. Such self-priming compositions may suitably be used to form dielectric coatings, photodefinable coatings, temporary adhesives, permanent adhesives, and the like.

The amounts of the hydrolyzed amino-alkoxysilane, water, organic solvent and coating oligomer employed in the self-priming coating composition depends upon a number of factors including the specific end-use application and the properties desired. If the self-priming coating composition is intended to have one or more coating oligomer layers subsequently applied to it, the self-priming coating composition will typically contain lesser amounts of the coating oligomer than when no subsequent coating oligomer layer is used. In general, regardless of its intended end-use, the self-priming coating composition comprises from 0.01 to 10 wt % of hydrolyzed amino-alkoxysilane, from 0.01 to 3 wt % water, from 10 to 99.98 wt % organic solvent, and from 0.01 to 90 wt % coating oligomer, where the weight percents are based on the total weight of the composition. Preferably, the self-priming coating compositions comprise form 0.01 to 5 wt % of hydrolyzed amino-alkoxysilane, more preferably from 0.01 to 3 wt %, and even more preferably from 0.01 to 2 wt %. When subsequent coating oligomer compositions will be disposed on the self-priming composition, it is preferred that the coating oligomers in the self-priming coating compositions are present in an amount of ≥0.01, more preferably ≥1, even more preferably from 2 to 20 wt %, and yet more preferably from 5 to 20 wt %. When subsequent coating oligomer compositions will not be disposed on the self-priming coating, it is preferred that the coating oligomer be present in the composition in an amount of ≥5, more preferably ≥10, and yet more preferably from 20 to 90 wt %. Preferred amounts of water vary from 0.05 to 2 wt %. Preferred amounts of organic solvent vary from 10 to 98 wt %, more preferably from 20 to 90 wt %, and still more preferably from 20 to 75 wt %. In one embodiment, the composition comprises from 0.01 to 10 wt % of hydrolyzed amino-alkoxysilane having a protected amino moiety, from 0.05 to 2 wt % water, from 40 to 99.5 wt % of organic solvent; and from 1 to 80 wt % of coating oligomer, based on the total weight of the composition. In another embodiment, the composition comprises from 0.01 to 10 wt % of hydrolyzed amino-alkoxysilane having a protected amino moiety, from 0.05 to 2 wt % water, from 10 to 99.9 weight percent of organic solvent, and from 0.01 to 90 percent by weight of coating oligomer, based on the total weight of the composition.

The self-priming coating compositions may be disposed on a device substrate to form a coated film using any of the methods described above for the adhesion promoting compositions. Spin-coating is a preferred method. Following deposition on a device substrate, the coated film is typically cured, such as by heating, exposure to actinic radiation (light), or a combination thereof. Photodefineable arylcyclobutenes are typically photocrosslinked prior to further cure. The specific curing conditions used depend on the particular oligomer selected, the particular application such as whether the coated film is a dielectric or an adhesive, as well as on other parameters known to those skilled in the art.

EXAMPLE 1

An adhesion promoting composition of the invention was prepared by combining bis(3-(trimethoxysilyl)propyl)amine (0.41 wt %), (3-(2-aminoethylamino)propyl)trimethoxysilane (0.21 wt %), and PGME (99.38 wt %). The composition was aged overnight at room temperature. Next, di-t-butyl dicarbonate (0.6 wt %) was added to the composition and the composition was allowed to react overnight to provide t-BOC protected amino moieties. The composition (Sample 1) was next filtered through 20 nm polypropylene filter.

EXAMPLE 2

The compatibility of Sample 1 with a base-reactive photodielectric was evaluated. Sample 1 and a commercially available developable benzocyclobutene photodielectric having acidic functionality were combined 1:1 weight ratio in a glass, screw-top vial, forming a clear solution.

COMPARATIVE EXAMPLE 1

A comparative adhesion promoting composition (Comparative 1) was prepared by combining bis(3-(trimethoxysilyl)propyl)amine (0.41 wt %), (3-(2-aminoethylamino)propyl)trimethoxysilane (0.21 wt %), and PGME (99.38 wt %). The composition was aged overnight at room temperature. Comparative 1 was combined with the commercially available developable benzocyclobutene photodielectric having acidic functionality from Example 2 in a 1:1 weight ratio in a glass, screw-top vial. A precipitate formed upon the mixing of Comparative 1 with the photodielectric material.

EXAMPLE 3

The adhesion promoters of Sample 1 and Comparative 1 were evaluated using a lithographic printing test. Each of Sample 1 and Comparative 1 was coated on a 200 mm test wafer using a Site Trac TT5-XP coater at a spin speed of 2000 rpm for 40 seconds followed by a 90° C. or 180° C. bake for 90 seconds to ensure solvent removal. No coating defects were observed for any adhesion promoter sample. The post bake coating thicknesses of the adhesion promoters are reported in Table 1. As can be seen from the data, the coating thickness of Sample 1 baked at 180° C. is much lower than when baked at 90° C. This difference in film thickness is indicative of deprotection of the amine moieties of the hydrolyzed amino-alkoxysilanes.

A benzocyclobutene dielectric resin was coated on each adhesion promoted wafer using a Site Trace TT6-XP at a spin speed around 1500 rpm to target a film thickness of approximately 6.5 μm. The spin coated dielectric was then soft baked at 90° C. for 90 seconds to ensure solvent removal. Next, the dielectric-coated wafers were exposed on an ASML 200 i-line stepper using a bright field reticle to print to print rows of variously sized posts (from 1 to 25 m) on the wafer. After exposure, a 15 minute post exposure hold was utilized to allow moisture diffusion back into the film. After exposure, the exposed areas of the dielectric resin were developed on a Site Trac TTP-X5 using a CD-26 developer solution employing a 60 second single puddle followed by a 90 second de-ionized water rinse. The post printing resolution is reported in Table 1. The post printing resolution is the minimum feature size remaining after development. As can be seen from the data in Table 1, the best resolution was achieved using Sample 1 that had been baked at 180° C. to cleave the amino protecting moiety.

TABLE 1

| Sample | Adhesion Promoter Bake Temperature | Coating thickness | Printed Post Resolution |
|---|---|---|---|
| Sample 1 | 90 ° C. | 328 Å | 5 μm |
| Sample 1 | 180 ° C. | 102 Å | 2 μm |
| Comparative 1 | 90 ° C | 161 Å | 4 μm |

EXAMPLE 4

An adhesion promoting composition of the invention was prepared by dissolving bis(3-(triethoxysilyl)propyl)amine (0.5 wt %) in a 95/5 w/w solvent mixture of propylene glycol methyl ether (PGME)/dipropylene glycol methyl ether (DPGME), then adding 1.2 molar amine equivalents of di-t-butyl dicarbonate to the composition, and allowing the mixture to react overnight to provide t-BOC protected amino moiety. Next, 2000 ppm of nitric acid and 1.18 wt % water were added and the composition was allowed to react to provide a hydrolyzed amino-alkoxysilane having a protected amino moiety (Sample 2), followed by filtration through a 0.1 μm polypropylene filter.

Sample 2 was combined with a commercially available base-reactive dielectric (CYCLOTENE™ 6505 resin, available from Dow Electronic Materials, Marlborough, Mass.) in a 9.5:5 weight ratio in a glass screw-capped vial. The mixture of Sample 2 and the dielectric material showed no precipitate formation.

Sample 2 was coated on a 200 mm silicon wafer according to the process of Example 3. Visual inspection showed no coating defects. The thickness of the adhesion promoting layer on the wafer was 133 Å as coated, and following baking at 150° C. for 60 seconds, the thickness of the of the adhesion promoting layer was 125 Å.

EXAMPLE 5

The procedure of Example 4 was repeated except that 1.58 equivalents of di-t-butyl dicarbonate were used, the PGME/DPGME ratio was 90/10, and 1 wt % of water was used. Visual inspection of the coated wafer showed no coating defects. The thickness of the adhesion promoting layer on the wafer was 124 Å as coated, and following baking was 114 Å.

EXAMPLE 6

An adhesion promoting composition of the invention was prepared by dissolving aminopropyl triethoxysilane in PGME, then adding 1.2 molar equivalents of di-t-butyl dicarbonate, and allowing the mixture to react overnight to provide t-BOC protected amino moiety. The total solids content in the composition was approximately 0.1%. Next 0.12 wt % of water was added and the composition allowed to react for 8 days to provide a hydrolyzed amino-alkoxysilane having a protected amino moiety (Sample 3). Four 200 mm wafers were coated with Sample 3 according to the procedure of Example 3. Visual inspection of all wafers showed no coating defects. One coated wafer was then baked at each of 175, 200, 225 and 250° C. for 60 seconds.

EXAMPLE 7

An adhesion promoting composition of the invention was prepared by dissolving bis-(triethoxysilylpropyl)amine in 90/10 PGME/DPGME, then adding 1.58 molar equivalents of di-t-butyl dicarbonate, and allowing the mixture to react overnight to provide t-BOC protected amino moiety. Next 1 wt % of water and 2000 ppm of nitric acid were added and the composition allowed to react to provide a hydrolyzed amino-alkoxysilane having a protected amino moiety (Sample 4).

EXAMPLE 8

The procedure of Example 7 was repeated except that the solvent was 95/5 w/w PGME/DPGME and 1.2 equivalents of di-t-butyl dicarbonate were used to produce Sample 5.

EXAMPLE 9

The procedure of Example 8 was repeated except that the bis-(triethoxysilylpropyl)amine was replaced with bis-(trimethoxysilylpropyl)amine to provide Sample 6.

EXAMPLE 10

Each of Samples 4-6 were used to coat 200 mm wafers according to the procedure of Example 3. Visual inspection of the coated wafers showed no coating defects. The thickness of each adhesion promoter coating was approximately 130 Å as coated.

The adhesion promoter coatings were baked at 150° C. for 60 seconds, and the film thicknesses were again measured and found to be on average 123 Å. A benzocyclobutene dielectric resin was coated on each of the adhesion promoted wafers and posts were lithographically printed according to the procedure of Example 3. The post printing resolution for each of Samples 4-6 was 1 to 2 μm.

EXAMPLE 11

An adhesion promoting composition of the invention is prepared by dissolving $N^1,N^1$-bis(3-(trimethoxysilyl)propyl) ethane-1,2-diamine (0.75 wt %) in PGME, then adding 1.2 molar equivalents of di-t-butyl dicarbonate. The mixture is allowed to react overnight to provide t-BOC protected amino moiety. Next, 2000 ppm of nitric acid and 2 wt % water are added and the composition is allowed to react to provide a hydrolyzed amino-alkoxysilane having a protected amino moiety (Sample 7).

EXAMPLE 12

An adhesion promoting composition of the invention is prepared by dissolving 3-(trimethoxysilyl)-N-(2-(trimethyoxysilyl)ethyl)-N-(3-(trimethoxysilyl)propyl)-propan-1-amine (0.5 wt %) in 95/5 w/w PGME/DPGME, then adding 1.25 molar equivalents of di-t-butyl dicarbonate. The mixture is allowed to react overnight to provide t-BOC protected amino moiety. Next, 2000 ppm of nitric acid and 2 wt % water are added and the composition is allowed to react to provide a hydrolyzed amino-alkoxysilane having a protected amino moiety (Sample 8).

EXAMPLE 13

A self-priming coating composition is prepared by combining 83.63 g of 40 wt % solution of aqueous developable, benzocyclobutene resin (Cyclotene™ 6505 resin) in a mixed solvent system of PROGLYDE™ DMM, PGMEA, anisole and 0.25 wt % of Sample 2. The composition is then thoroughly mixed. The composition is then spin-coated on a 200 mm wafer.

EXAMPLE 14

The procedure of Example 13 is repeated except that the composition further contains 250 ppm of tolyltriazole as a metal passivating agent.

EXAMPLE 15

The procedure of Example 13 is repeated except that the composition further contains a thermal acid generator in a molar ratio of thermal acid generator to Sample 2 of 0.8:1.

What is claimed is:

1. A composition comprising: a hydrolyzed amino-alkoxysilane having a protected amino moiety; water; and organic solvent.

2. The composition of claim 1 further comprising an oligomer chosen from polyarylene oligomers, poly(cyclic-olefin) oligomers, arylcyclobutene oligomers, vinyl aromatic oligomers, and mixtures thereof.

3. A process for manufacturing an electronic device, comprising:
   providing an electronic device substrate having a surface to be coated;
   treating the surface to be coated with the composition of claim 2; and
   curing the oligomer.

4. The composition of claim 1 wherein the composition further comprises a metal passivation agent.

5. The composition of claim 1 wherein the protected amino moiety is cleavable with heat, acid or a combination thereof.

6. The composition of claim 1 wherein the hydrolyzed amino-alkoxysilane is a hydrolyzed amino-poly(alkoxysilane).

7. The composition of claim 6 wherein the hydrolyzed amino-poly(alkoxysilane) has the formula:

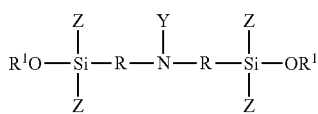

wherein each R is independently chosen from $(C_1-C_6)$alkylidene, $(C_1-C_6)$alkylene, $(C_6-C_{10})$arylene, and $(C_2-C_6)$alkenylene; each $R^1$ is independently chosen from H, $(C_1-C_6)$alkyl and $(C_1-C_6)$acyl; each Z is independently chosen from $(C_1-C_6)$alkyl, $(C_2-C_6)$alkenyl and $-OR^1$; and Y=an amine protecting group; wherein each R is optionally substituted with one or more of $-(C_1-C_6)$alkylidene-$SiZ_2(OR^1)$ and $-(C_1-C_6)$alkylene-$SiZ_2(OR^1)$, and wherein at least one $R^1$ is H.

8. The composition of claim 1 wherein the hydrolyzed amino-alkoxysilane has the formula:

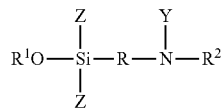

wherein R is independently chosen from $(C_1-C_6)$alkylidene, $(C_1-C_6)$alkylene, $(C_6-C_{10})$arylene, and $(C_2-C_6)$alkenylene; $R^1$ is independently chosen from H, $(C_1-C_6)$alkyl and $(C_1-C_6)$acyl; $R^2$ is chosen from H, $-R-SiZ_2(OR^1)$, $(C_1-C_6)$alkyl, $(C_6-C_{10})$aryl and $(C_7-C_{15})$alkaryl; each Z is independently chosen from $(C_1-C_6)$alkyl, $(C_2-C_6)$alkenyl and $-OR^1$; and Y=an amine protecting group; wherein each R is optionally substituted with one or more of $-(C_1-C_6)$alkylidene-$SiZ_2(OR^1)$ and $-(C_1-C_6)$alkylene-$SiZ_2(OR^1)$, and wherein at least one $R^1$ is H.

9. The composition of claim 1 wherein the protected amino moiety is chosen from 9-fluorenylmethyl carbamate, t-butyl carbamate, benzyl carbamate, acetamide, trifluoroacetamide, benzylamine, tritylamine, benzylideneamine, and tosylamide.

10. A process for manufacturing an electronic device, comprising:
    providing an electronic device substrate having a surface to be coated;
    treating the surface to be coated with the composition of claim 1;
    disposing a coating composition comprising an oligomer chosen from polyarylene oligomers, poly(cyclic-olefin) oligomers, arylcyclobutene oligomers, vinyl aromatic oligomers, and mixtures thereof on the treated surface; and
    curing the coating composition.

\* \* \* \* \*